United States Patent
Bong et al.

(10) Patent No.: US 8,076,998 B2
(45) Date of Patent: Dec. 13, 2011

(54) ELECTROMAGNETIC BANDGAP STRUCTURE AND PRINTED CIRCUIT BOARD

(75) Inventors: Kang-Wook Bong, Seoul (KR); Han Kim, Yongin-si (KR); Dae-Hyun Park, Ulsan (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 272 days.

(21) Appl. No.: 12/466,704

(22) Filed: May 15, 2009

(65) Prior Publication Data

US 2010/0127790 A1   May 27, 2010

(30) Foreign Application Priority Data

Nov. 26, 2008 (KR) .................. 10-2008-0117907

(51) Int. Cl.
  *H03H 7/00* (2006.01)
(52) U.S. Cl. ...................... 333/167; 333/246
(58) Field of Classification Search .............. 333/167, 333/246; 174/762–765, 262–265; 361/792–795
See application file for complete search history.

(56) References Cited

U.S. PATENT DOCUMENTS 6,300,576 B1 * 10/2001 Nakamura et al. ............ 174/261

* cited by examiner

*Primary Examiner* — Robert Pascal
*Assistant Examiner* — Kimberly Glenn
(74) *Attorney, Agent, or Firm* — McDermott Will & Emery LLP

(57) ABSTRACT

An electromagnetic bandgap structure is disclosed. In accordance with an embodiment of the present invention, the electromagnetic bandgap structure that blocks a noise of a certain frequency band can include 4 or more conductive plates, a first stitching via, which electrically connects any two of the conductive plates with each other by having a part of the first stitching via pass through a planar surface that is different from a planar surface of the conductive plates, a second stitching via, which electrically connects another two of the conductive plates with each other by having a part of the second stitching via pass through a planar surface that is different from a planar surface of the conductive plates, and a stitching via chain, which electrically connects the first stitching via and the second stitching via with each other.

17 Claims, 16 Drawing Sheets

ELECTROMAGNETIC BANDGAP STRUCTURE AND PRINTED CIRCUIT BOARD

CROSS-REFERENCE TO RELATED APPLICATIONS

This application claims the benefit of Korean Patent Application No. 10-2008-0117907, filed with the Korean Intellectual Property Office on Nov. 26, 2008, the disclosure of which is incorporated herein by reference in its entirety.

BACKGROUND

1. Technical Field

The present invention relates to an electromagnetic bandgap structure, more specifically to an electromagnetic bandgap structure and a printed circuit board having the same that prevent a signal ranging a predetermined frequency band from being transmitted.

2. Description of the Related Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise problem, caused by the transfer of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be evident that the printed circuit board can be modified to have a 2, 6 or 8-layered structure.

As shown in FIG. 1, the printed circuit board 100 includes four metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). Here, it is assumed that the two electronic circuits 130 and 140 are digital circuits.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias. As an example, a via 160 electrically connects the metal layers of the reference numerals 110-1, 110-3, and 110-4 as shown in FIG. 1.

At this time, if the first electronic circuit 130 and the second electronic circuit 140 have different operation frequencies, a conductive noise 150 caused by an operation frequency of the first electronic circuit 130 and its harmonics components is transferred to the second electronic circuit 140. This has a disadvantageous effect on the accurate function/operation of the second electronic circuit 140.

With the growing complexity of electronic apparatuses and higher operation frequencies of digital circuits, it is increasingly difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

Accordingly, an electromagnetic bandgap structure (EBG) is recently receiving attention as a scheme to solve the aforementioned conductive noise. This is for the purpose of blocking a signal ranging a certain frequency band by arranging the EBG having a certain structure in a printed circuit board, and the typical EBG has roughly two, namely a Mushroom type EBG (MT-EBG) and a Planar type EBG (PT-EBG).

A general form of the MT-EBG is illustrated in FIG. 2.

For example, the MT-EBG has the structure in which a plurality of EBG cells (refer to the reference numeral 230 of FIG. 2) having a mushroom form are interposed between two metal layers which function as a power layer and a ground layer. FIG. 2 shows only four EBG cells for the convenience of illustration.

With reference to FIG. 2, the MT-EBG 200 further forms a metal plate 231 between a first metal layer 210 and a second metal layer 220 that function as each one of the ground layer and the power layer, and has a form in which the mushroom type structures 230 connecting the first metal layer 210 and the metal plate 231 through a via 232 are repeatedly arranged. At this time, a first dielectric layer 215 is interposed between the first metal layer 210 and the metal plate 231, and a second dielectric layer 225 is interposed between the metal plate 231 and the second metal layer 220.

Such MT-EBG 200 performs the function as a sort of band stop filter by having the state of which a capacitance component formed by the second metal layer 220, the second dielectric layer 225 and the metal plate 231, and an inductance component formed by the via 232 penetrating the first dielectric layer 215 and connecting the first metal layer 210 and the metal plate 231, are connected in L-C series between the first metal layer 210 and the second layer 220.

However, the largest demerit of this structure is the increase of layers, because it needs at least 3 layers to implement the MT-EBG 200. In this case, not only the manufacturing cost of the PCB increases, but also the design freedom is limited.

On the one hand, PT-EBG is illustrated in FIG. 3.

PT-EBG has a structure in which a plurality of EBG cells (refer to the reference numeral 320-1 of FIG. 3) having a certain pattern are repeatedly arranged through any entire metal layer that functions as each one of the ground layer and the power layer. FIG. 3 also shows only four EBG cells for the convenience of illustration.

With reference to FIG. 3, PT-EBG 300 has a form in which any metal layer 310 and a plurality of metal plates 321-1, 321-2, 321-3 and 321-4, which are placed on another planar surface, are bridged to each other through a certain part of metal plates (the edge end of each metal plate in FIG. 3) by metal branches 322-1, 322-2, 322-3 and 322-4.

At this time, the metal plates 321-1, 321-2, 321-3, and 321-4 having a large size constitute the low impedance area and the metal branches having a small size constitute the high impedance area. Accordingly, PT-EBG performs the function as a band stop filter that can block a noise ranging a certain frequency band through the structure in which the low impedance area and the high impedance area are repeatedly formed in turn.

Although such PT-EBG structure has a merit that is enough to constitute the bandgap structure by using only two layers in contrast to the structure of MT-EBG, there is not only a difficulty in making cells smaller but also a design limit, which makes it hard to apply to various application products because it is formed in a lager area. This is because PT-EBG forms the EBG structure by not utilizing various parameters but using only two impedance components.

As described above, the EBG structures according to the conventional technology, such as the MT-EBG and the PT-EBG; have a limit in adjusting each bandgap frequency band appropriate to the conditions and features that are required for various application products or lower a conductive noise below the intended noise level within a pertinent bandgap frequency band.

Accordingly, the research for the EBG structure being extensively applied to various application products for which the required bandgap frequency bands separately differ, not to mention solving the aforementioned conductive noise problem, is urgently needed.

SUMMARY

Accordingly, the present invention provides an electromagnetic bandgap structure and a printed circuit board having the same that can block a conductive noise of a certain frequency band.

The present invention also provides a printed circuit board that can solve a conductive noise problem through an electromagnetic bandgap structure having a certain structure in the printed circuit board without using a bypass capacitor or a decoupling capacitor.

In addition, the present invention provides an electromagnetic bandgap structure and a printed circuit board having the design flexibility and design freedom appropriate for the printed circuit board and being extensively applied to various application products (for example, an electronic apparatus (e.g. a mobile communication terminal) including an RF circuit and a digital circuit which are placed in the same board, SiP (System in Package), and network board, etc.) by the realization of various bandgap frequency band.

Other problems that the present invention solves will become more apparent through the following description.

An aspect of the present invention provides an electromagnetic bandgap structure that can block a noise of a certain frequency band.

In accordance with an embodiment of the present invention, an electromagnetic bandgap structure includes 4 or more conductive plates, a first stitching via, which electrically connects any two of the conductive plates with each other by having a part of the first stitching via pass through a planar surface that is different from a planar surface of the conductive plates, a second stitching via, which electrically connects another two of the conductive plates with each other by having a part of the second stitching via pass through a planar surface that is different from a planar surface of the conductive plates, and a stitching via chain, which electrically connects the first stitching via and the second stitching via with each other.

In an embodiment of the present invention, the stitching via chain can be another stitching via electrically connecting the first stitching via and the second stitching via with each other by having a part of the stitching via chain pass through a planar surface that is different from the planar surfaces through which the first stitching via or the second stitching via passes.

In an embodiment of the present invention, the stitching via chain can include a first via, which has one end part connected to the part of the first stitching via, a second via, which has one end part connected to the part of the second stitching via, and a conductive connection pattern, which connects the other end part of the first via and the other end part of the second via with each other on a same planar surface.

In an embodiment of the present invention, the stitching via chain can be a conductive connection pattern connecting the part of the first stitching via and the part of the second stitching via with each other on a same planar surface.

In an embodiment of the present invention, the conductive connection pattern can be manufactured as a straight-line form or a line form broken one or more times.

In an embodiment of the present invention, if further comprising a conductive layer that is placed between the conductive plates and dielectric layers, a clearance hole can be formed in a part of the conductive layer coinciding with a path through which the first stitching via, the second stitching via and the stitching via chain pass.

Another aspect of the present invention provides a printed circuit board in which an electromagnetic bandgap structure is disposed in an area of a noise transferable path between a noise source point and a noise blocking destination point of the printed circuit board.

Here, an electromagnetic bandgap structure includes 4 or more conductive plates, a first stitching via, which electrically connects any two of the conductive plates with each other by having a part of the first stitching via pass through a planar surface that is different from a planar surface of the conductive plates, a second stitching via, which electrically connects another two of the conductive plates with each other by having a part of the second stitching via pass through a planar surface that is different from a planar surface of the conductive plates, and a stitching via chain, which electrically connects the first stitching via and the second stitching via with each other.

In an embodiment of the present invention, the stitching via chain can be another stitching via electrically connecting the first stitching via and the second stitching via with each other by having a part of the stitching via chain pass through a planar surface that is different from the planar surfaces through which the first stitching via or the second stitching via passes.

In an embodiment of the present invention, the stitching via chain can include a first via, which has one end part connected to the part of the first stitching via, a second via, which has one end part connected to the part of the second stitching via, and a conductive connection pattern, which connects the other end part of the first via and the other end part of the second via with each other on a same planar surface.

In an embodiment of the present invention, the stitching via chain can be a conductive connection pattern, which connects the part of the first stitching via and the part of the second stitching via with each other on a same planar surface.

In an embodiment of the present invention, the conductive connection pattern can be manufactured as a straight-line form or a line form broken one or more times.

In an embodiment of the present invention, if further comprising a conductive layer that is placed between the conductive plates and dielectric layers, a clearance hole can be formed in a part of the conductive layer coinciding with a path through which the first stitching via, the second stitching via and the stitching via chain pass.

In an embodiment of the present invention, the conductive plates can be electrically connected to one of a ground layer and a power layer, and the conductive layer can be electrically connected to the other of the ground layer and the power layer.

In an embodiment of the present invention, the conductive plates can be electrically connected to one of a ground layer and a signal layer, and the conductive layer can be electrically connected to the other one of the ground layer and the signal layer.

In an embodiment of the present invention, if two electronic circuits having different operation frequencies are installed in the printed circuit board, the noise source point and the noise blocking destination point can correspond to one position and the other position, respectively, in which the two electric circuits are to be installed.

Additional aspects and advantages of the present invention will be set forth in part in the description which follows, and in part will be obvious from the description, or may be learned by practice of the invention.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" are used only to distinguish one element from the other.

Hereinafter, some examples of an electromagnetic bandgap structure including a stitching via having a basic principle similar to a blocking noise principle in accordance with some embodiments of the present invention will be described with reference to FIG. 4A through FIG. 4C for easy understanding of the present invention before an electromagnetic bandgap structure and a printed circuit board having the same are described with reference to FIG. 6 through FIG. 9.

Although a metal layer, a metal plate and a metal trace are used throughout the description of an electromagnetic bandgap structure of the present invention, it shall be evidently understood by any person of ordinary skill in the art that any other conductive layers, plates and traces can be substituted for the metal layer, the metal plate and the metal trace.

Figure 4A:
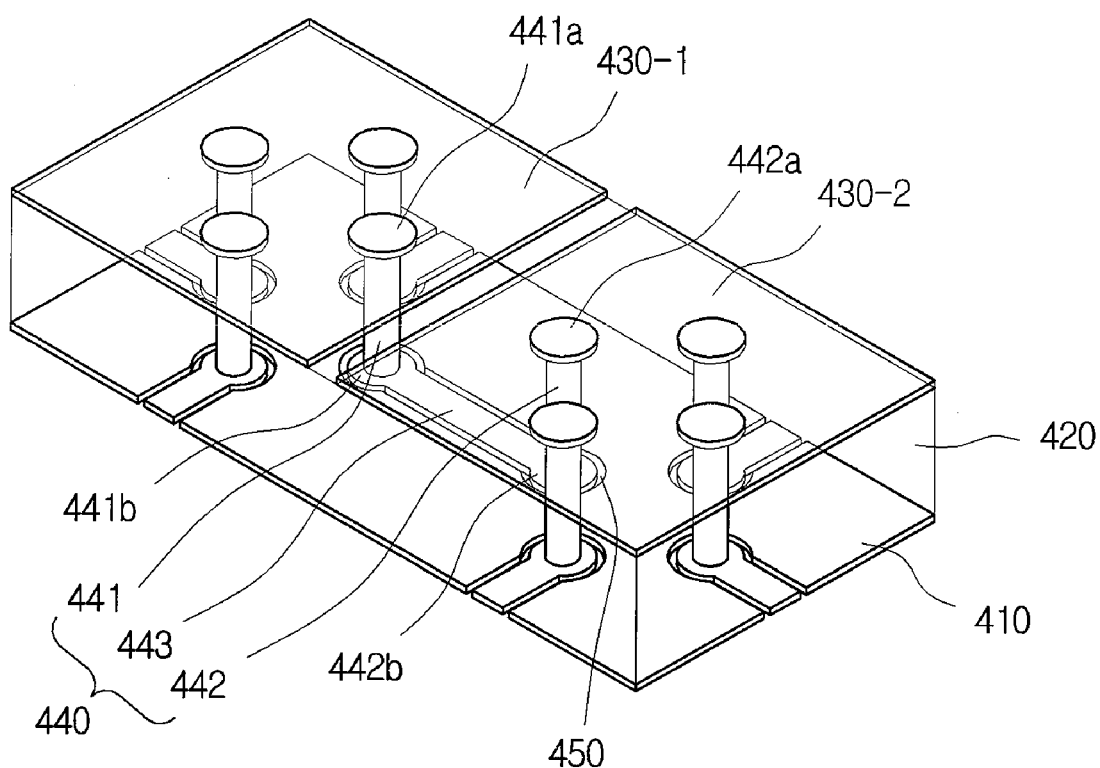
FIG. 4A is a 3-D perspective view showing an electromagnetic bandgap structure including a stitching via having a block principle similar to the present invention.
Figure 4B:
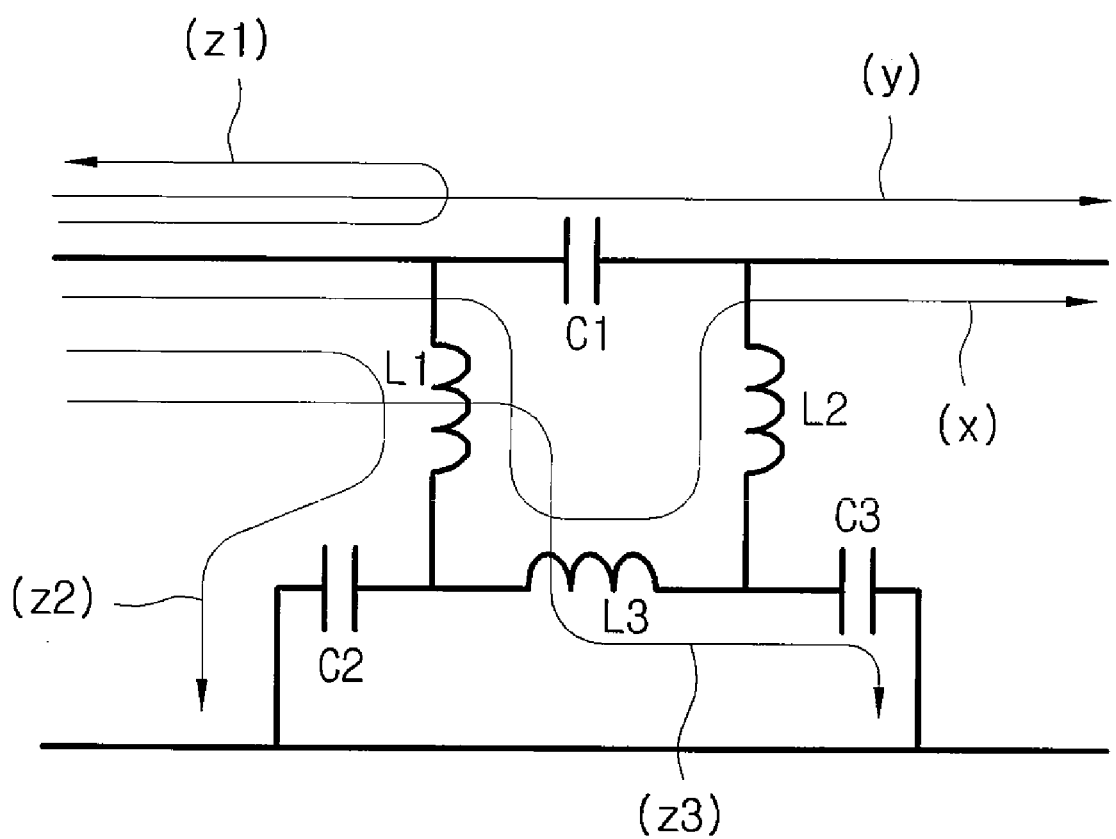
FIG. 4B is a schematic view showing an equivalent circuit of the electromagnetic bandgap structure shown in FIG. 4A.
Figure 4C:
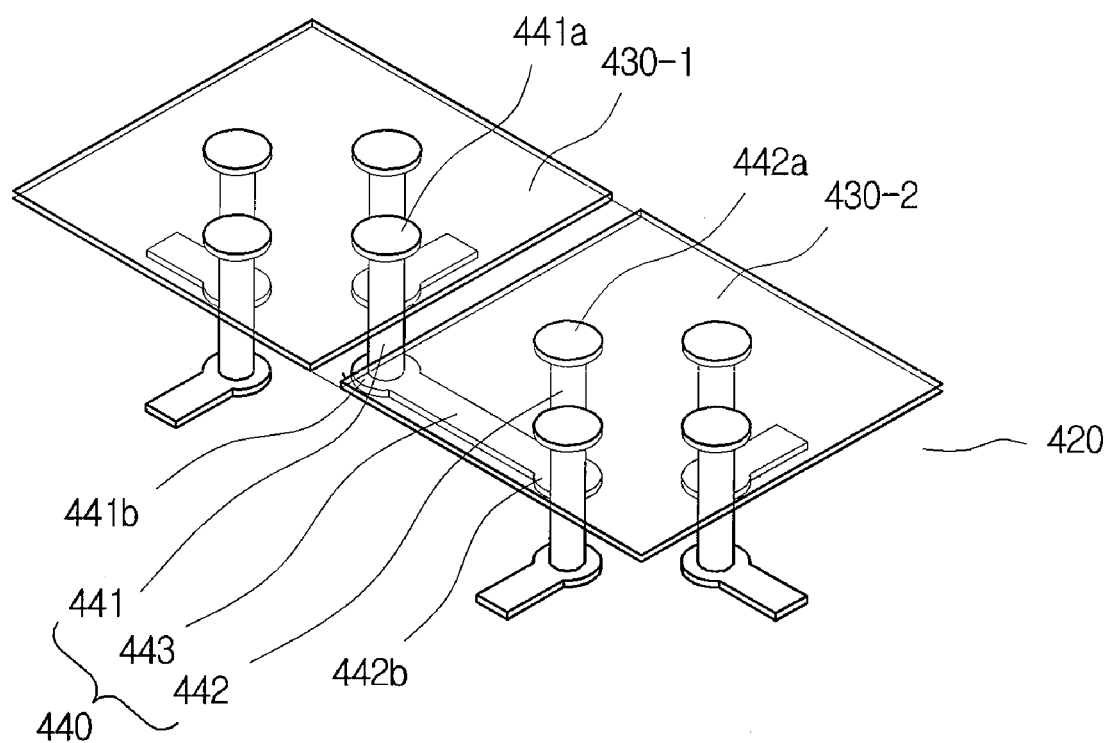
FIG. 4C is a 3-D perspective view showing a transformational example of the electromagnetic bandgap structure shown in FIG. 4A.

Also, even though FIG. 4A and FIG. 4C show only two metal plates for the convenience of illustration, the electromagnetic bandgap structure can have a plurality of metal plates repeatedly arranged as its elements as shown in FIG. 5A through FIG. 5E (the same can be applied to FIG. 6 through FIG. 9).

An electromagnetic bandgap structure 400 shown in FIG. 4A can include a metal layer 410, a plurality of metal plates 430-1 and 430-2 (hereinafter, referred to as a first metal plate 430-1 and a second metal plate 430-2) spaced from the metal layer 410 and a stitching via 440. The electromagnetic bandgap structure 400 of FIG. 4A can have 2-layered planar structure including a first layer that can consist of the metal layer 410 and a second layer that can consist of the plurality of metal plates 430-1 and 430-2. A dielectric layer 420 can be interposed between the metal layer 410 and the plurality of metal plates 430-1 and 430-2.

Here, FIG. 4A shows only elements constituting the electromagnetic bandgap structure (i.e. the only part constituting the 2-layered electromagnetic bandgap including the stitching via) for the convenience of illustration. Accordingly, the metal layer 410, and the plurality of metal plates 430-1 and 430-2 shown in FIG. 4A may be any two layers of a multi-layered printed circuit board. In other words, it shall be evident that there can be at least one additional metal layer below the metal layer 410, above the metal plates 430-1 and 430-2 and/or between the metal layer 410 and the metal plates 430-1 and 430-2. Similarly, this can be applied to the present invention shown in FIG. 6 through FIG. 9.

In addition, the electromagnetic bandgap structure 400 shown in FIG. 4A (the same can be applied to the present invention shown in FIG. 6) can be placed between any two metal layers separately constituting the power layer and the ground layer in order to block a conductive noise. Since the conductive noise problem is not limited to the space between the power layer and the ground layer, the electromagnetic bandgap structure shown in FIG. 4A can be placed between any two ground layers or power layers placed on different layers from each other in a multi-layered printed circuit board.

Accordingly, the metal layer 410 may be any one metal layer for transferring an electric signal in a printed circuit board. The metal layer 410, for example, can be any metal layer functioning as the power layer or the ground layer, or any metal layer functioning as a signal layer constituting a signal line.

The metal layer 410 can be placed on a planar surface different from the planar surface in which the plurality of metal plates are placed and electrically separated from the plurality of metal plates. In other words, the metal layer 410 can form a layer that is different from the plurality of metal plates 430-1 and 430-2 with regard to electrical signals in the printed circuit board. For example, if the metal layer 410 is the power layer, the metal plates can be electrically connected to the ground layer. If the metal layer 410 is the ground layer, the metal plates can be electrically connected to the power layer. Alternatively, if the metal layer 410 is the signal layer, the metal plates can be electrically connected to the ground layer. If the metal layer 410 is the ground layer, the metal plates can be electrically connected to the signal layer. Similarly, this can be applied to FIG. 6 through FIG. 9.

The plurality of metal plates 430-1 and 430-2 can be placed on a planar surface above the metal layer 410. Any two metal plates can be electrically connected to each other through a stitching via. As such, each stitching via electrically connecting any two metal plates to each other can electrically connect every metal plate as one circuit.

Here, FIG. 4A shows the form (i.e. the form of FIG. 5A) that a metal plate and its adjacent metal plates can be electrically connected to each other through one stitching via each, and as a result, every metal plate can be electrically connected to each other. However, as long all metal plates can be formed as a closed loop by being electrically connected to each other, it can be possible to use any method of connecting the metal plates to each other through the stitching via.

Figure 5A:
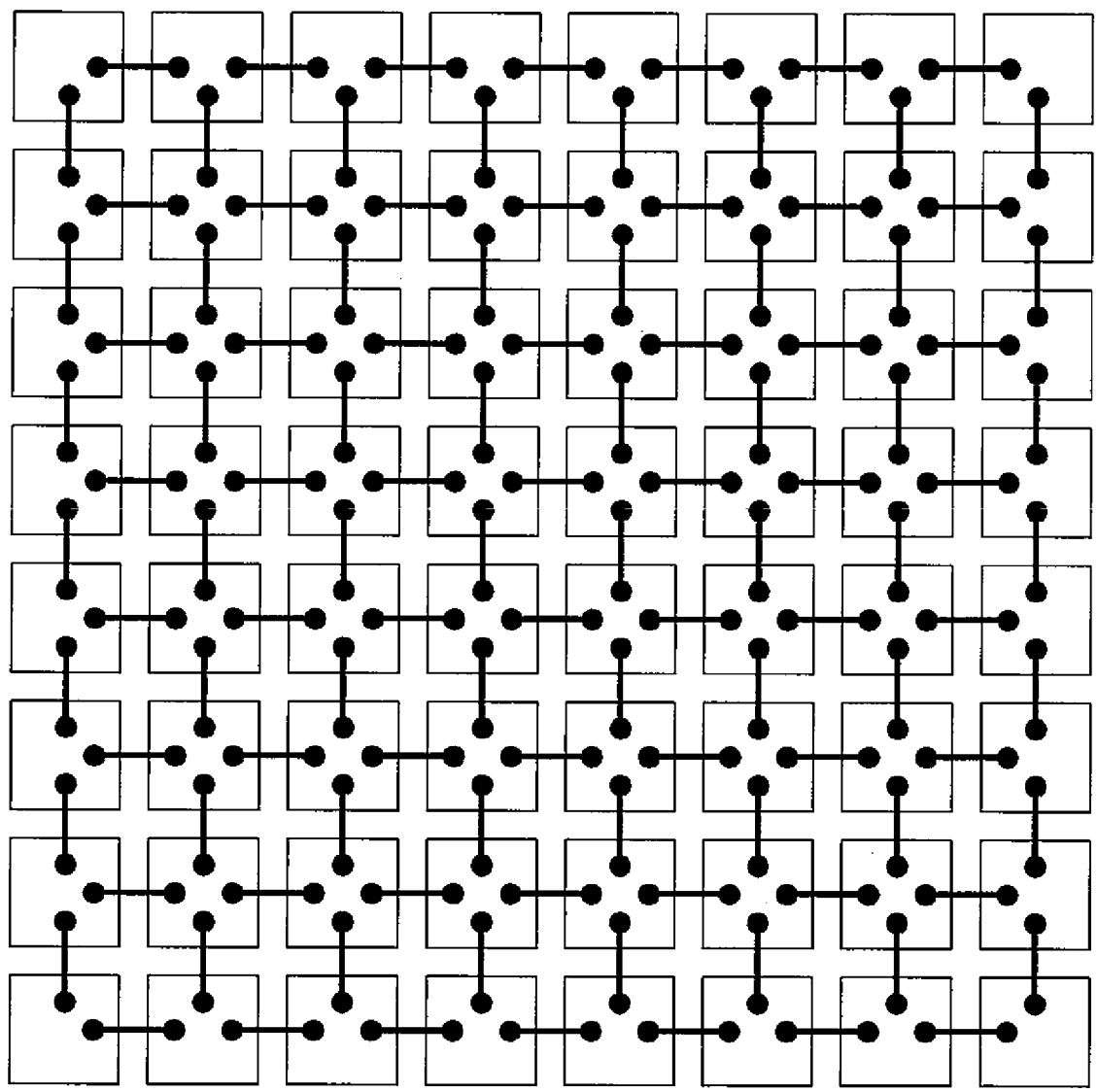
FIG. 5A is a plan view showing a configuration of an electromagnetic bandgap structure including a stitching via having a rectangular metal plate.
Figure 5B:
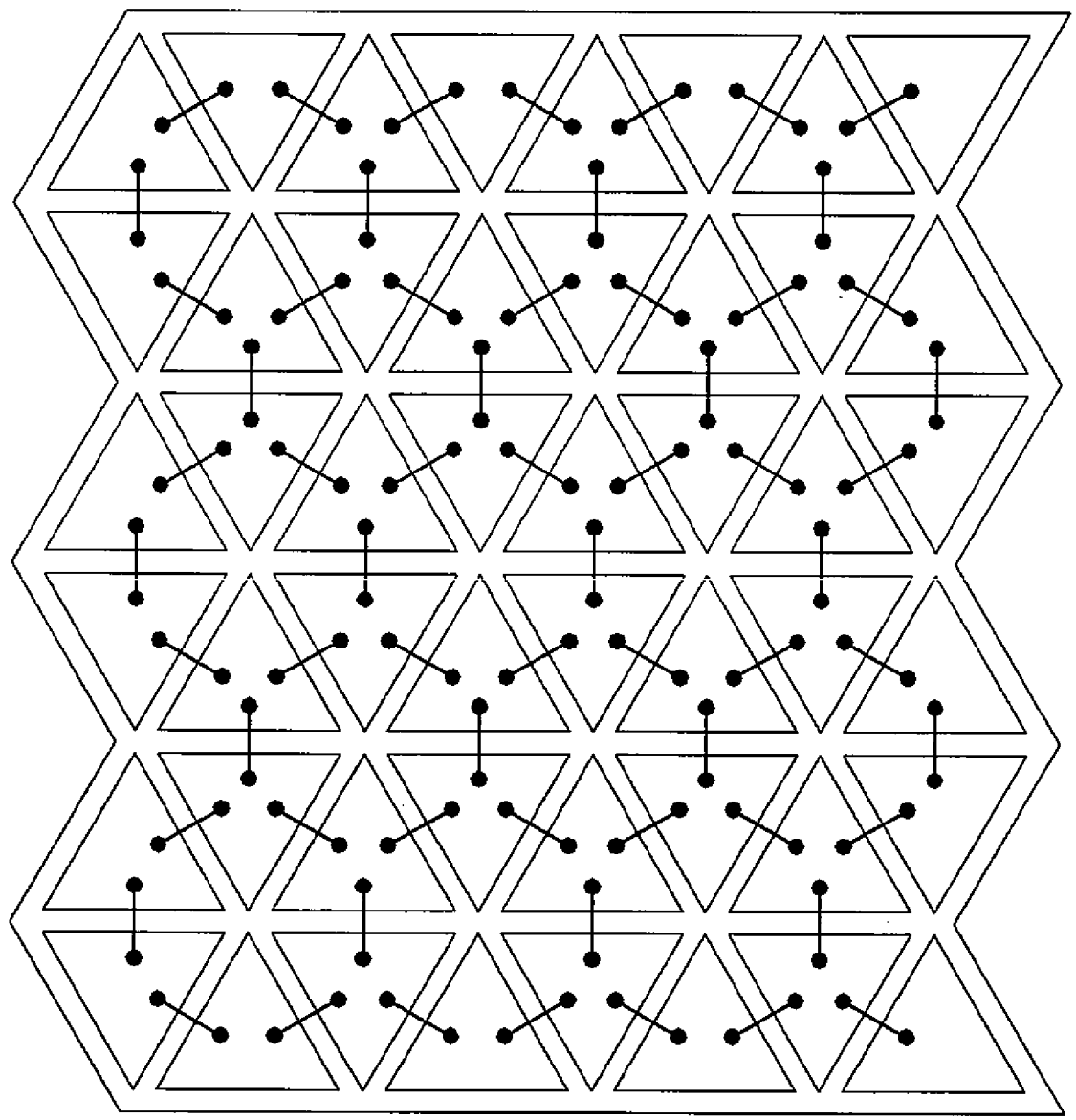
FIG. 5B is a plan view showing a configuration of an electromagnetic bandgap structure including a stitching via having a triangular metal plate.
Figure 5C:
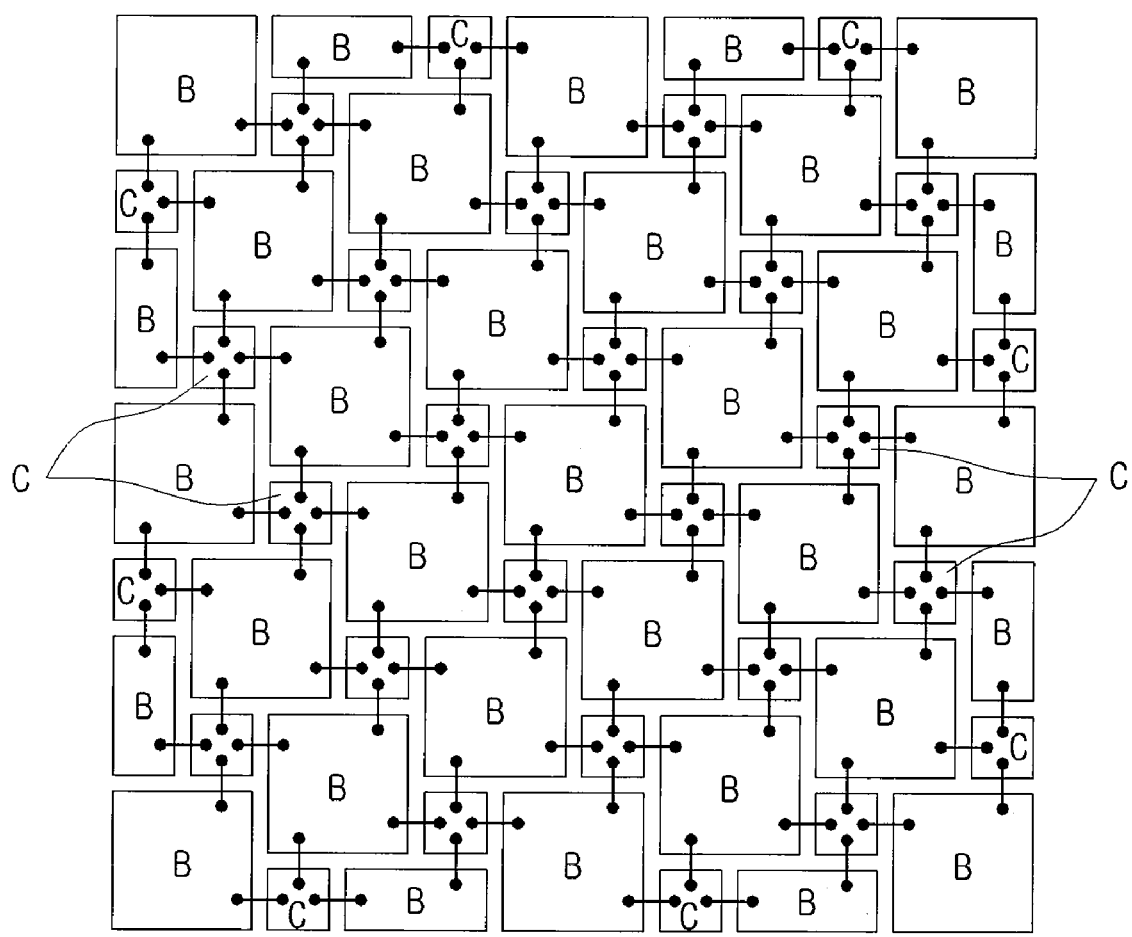
FIG. 5C and FIG. 5D are plan views showing a configuration of an electromagnetic bandgap structure including a stitching via consisting of a plurality of groups having different sized metal plates.
Figure 5D:
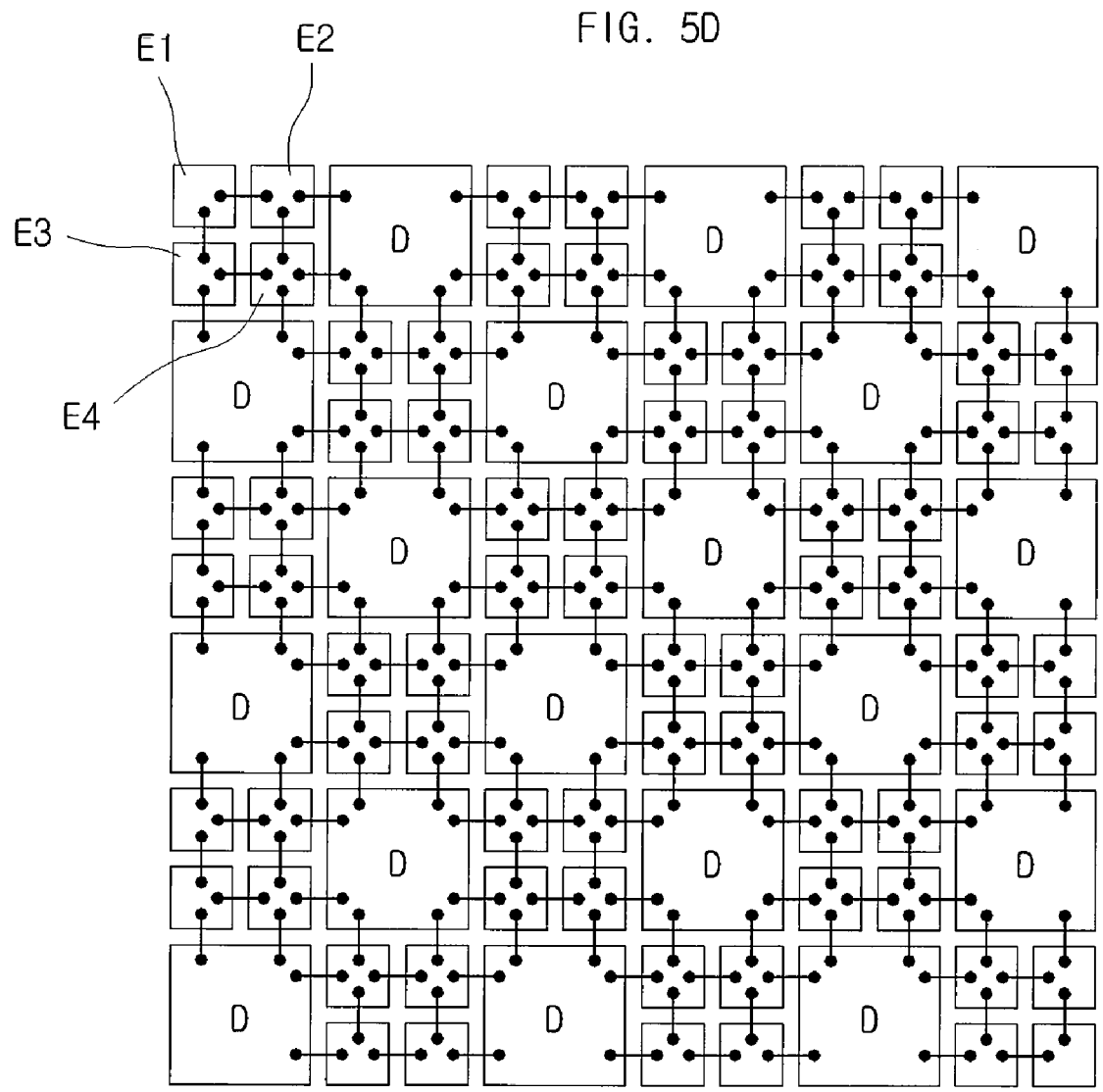
Figure 5E:
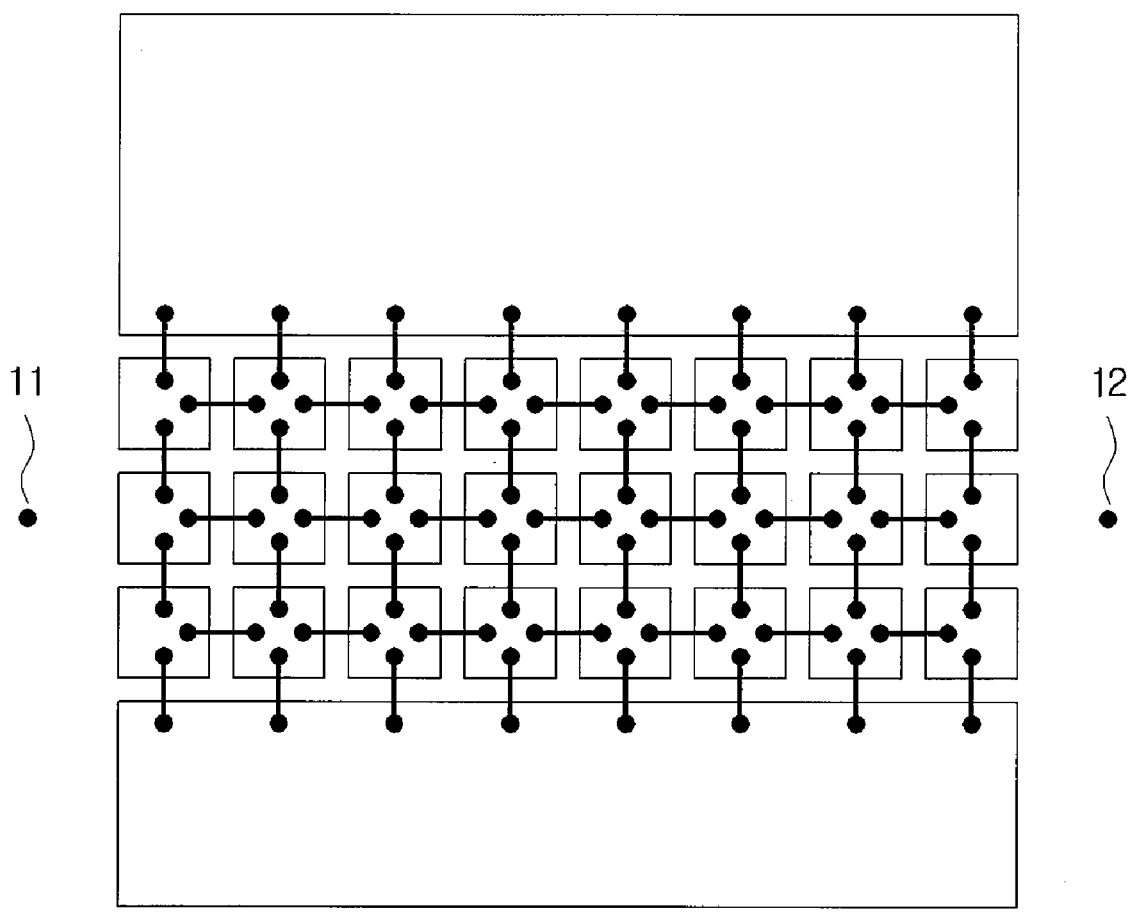
FIG. 5E is a plan view showing a band-shaped configuration of an electromagnetic bandgap structure including a stitching via.
Figure 6:
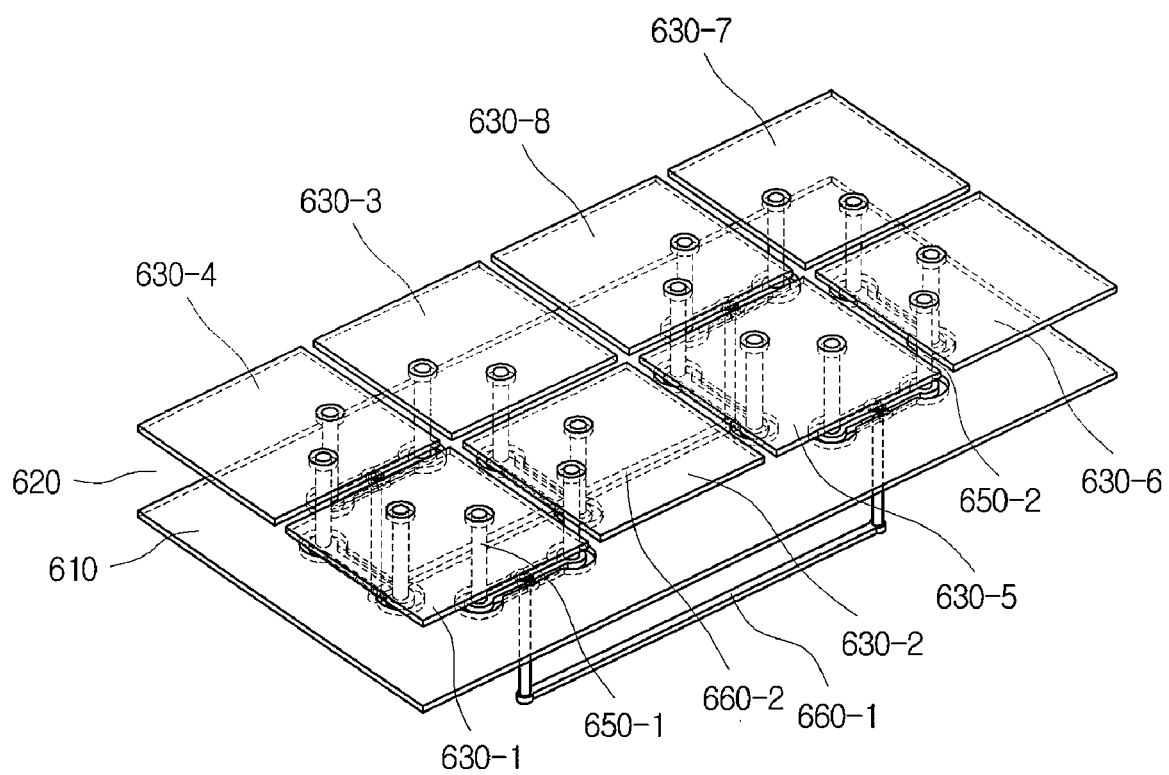
FIG. 6 is a 3-D perspective view showing an electromagnetic bandgap structure including a stitching via chain in accordance with an embodiment of the present invention.
Figure 8:
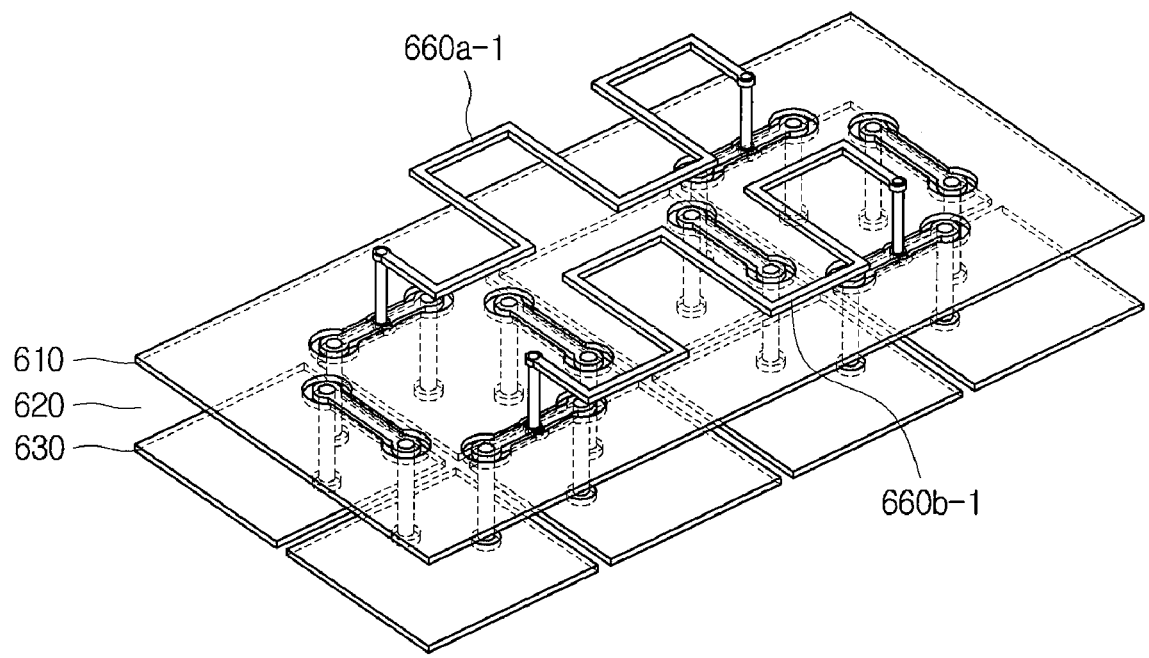
FIG. 8 is a 3-D perspective view showing some transformational example of the electromagnetic bandgap structure shown in FIG. 6.

Also, even though FIG. 4A shows each of metal plates having a square shape of the same size for the convenience of illustration, various other modifications can be possible (the same can be applied to FIG. 6 and FIG. 8). This will be briefly described with reference to FIG. 5A through FIG. 5E.

For example, the metal plates can have various polygonal shapes including not only a rectangle as shown in FIG. 5A, and a triangle as shown in FIG. 5B, but also a hexagon, an octagon, etc. Of course, the metal plate may not be limited to a certain shape such as a circle or an ellipse. Each of the metal plates can also have the same size (e.g. area and thickness) as shown in FIG. 5A, FIG. 5B and FIG. 5E. If the metal plates have different sizes, the metal plates can be distinguished and placed according to each of a plurality of groups having different sizes as shown in FIG. 5C or FIG. 5D.

In the case of FIG. 5C, metal plates B having a relatively bigger size and metal plates C having a relatively smaller size can be alternately arranged. In the case of FIG. 5D, metal plates D having a relatively bigger size and metal plates E1, E2, E3 and E4 having a relatively smaller size can be arranged. The small metal plates E1, E2, E3 and E4 can be grouped in a 2×2 form, and can occupy the area similar to the large metal plate D.

In addition, while the cells of the electromagnetic bandgap structures can be densely arranged on the whole part of an inner surface of the printed circuit board as shown in FIG. 5A through 5D, the cells can be naturally arranged on some paths as shown in FIG. 5E. For example, as shown in FIG. 5E, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 5E, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Figure 1:
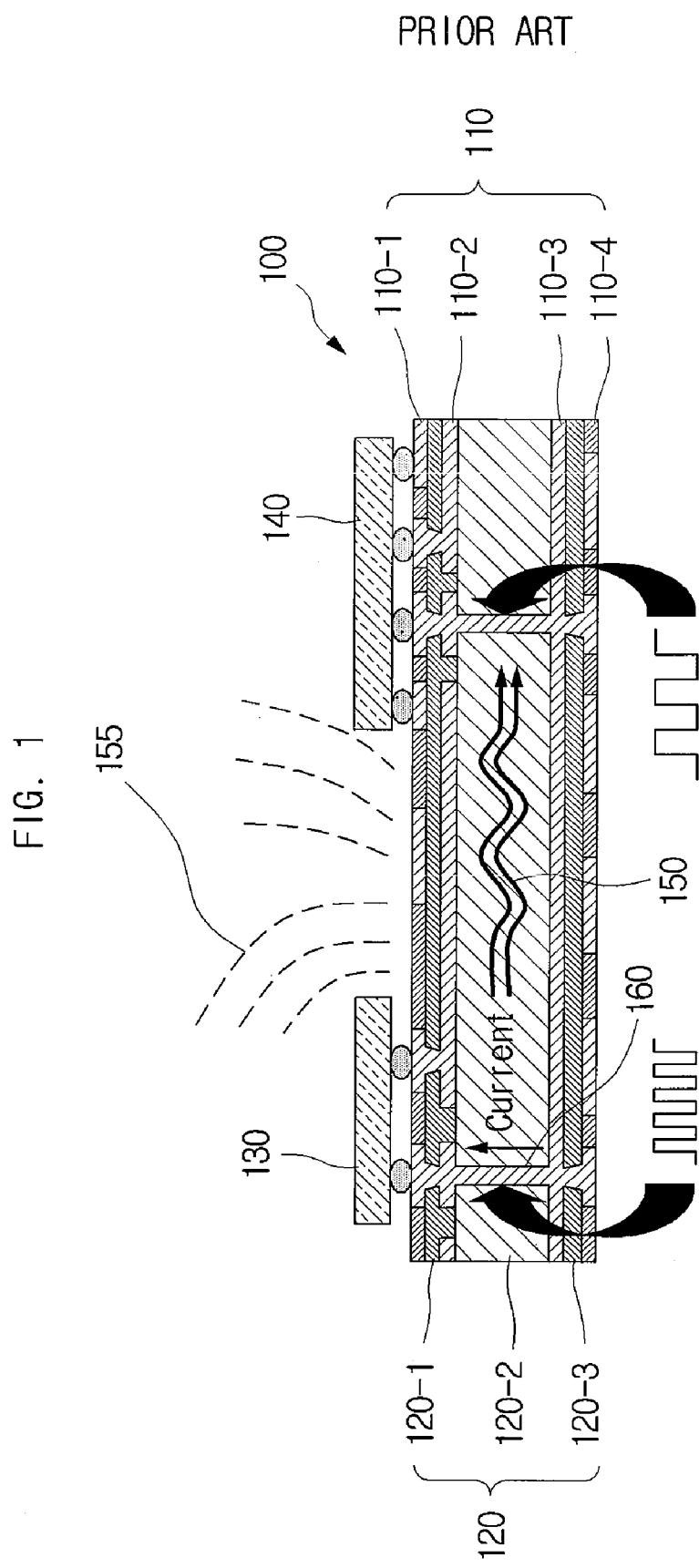
FIG. 1 is a cross-sectional view showing a printed circuit board including two electronic circuits having different operation frequencies.
Figure 2:
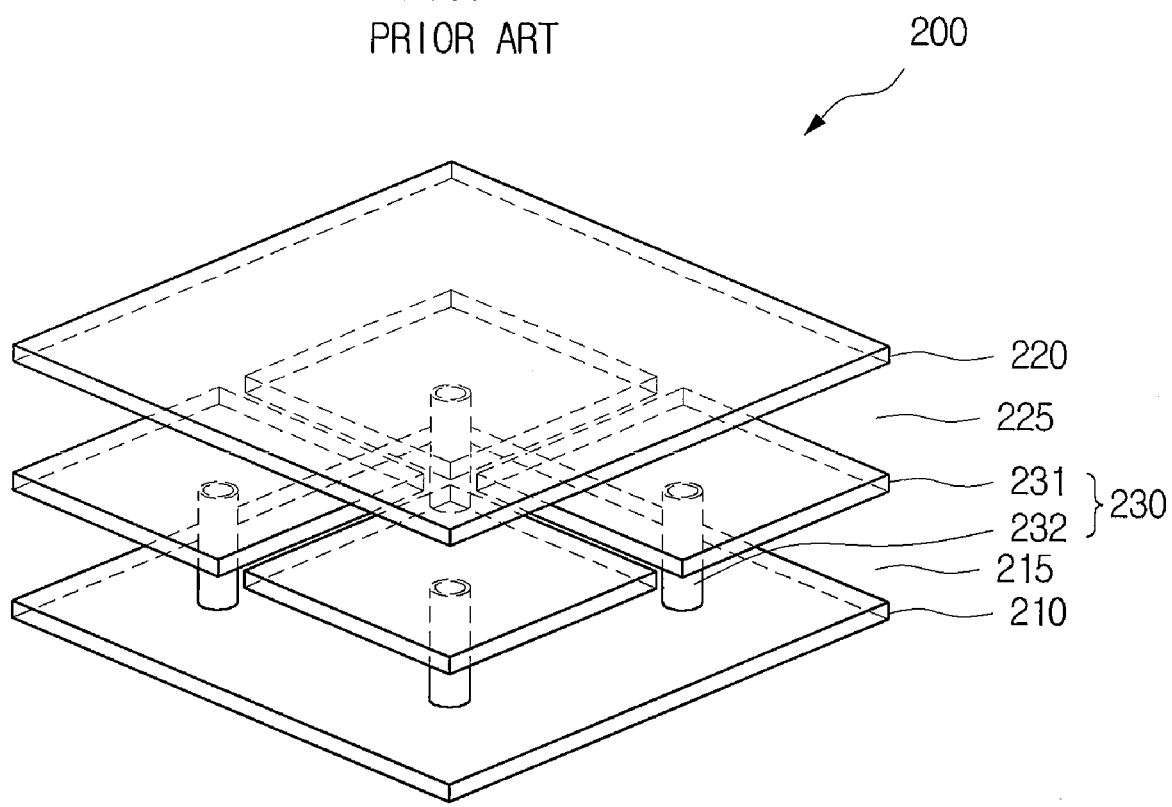
FIG. 2 is a schematic view showing an MT-EBG structure as an electromagnetic bandgap structure in accordance with a conventional art.
Figure 3:
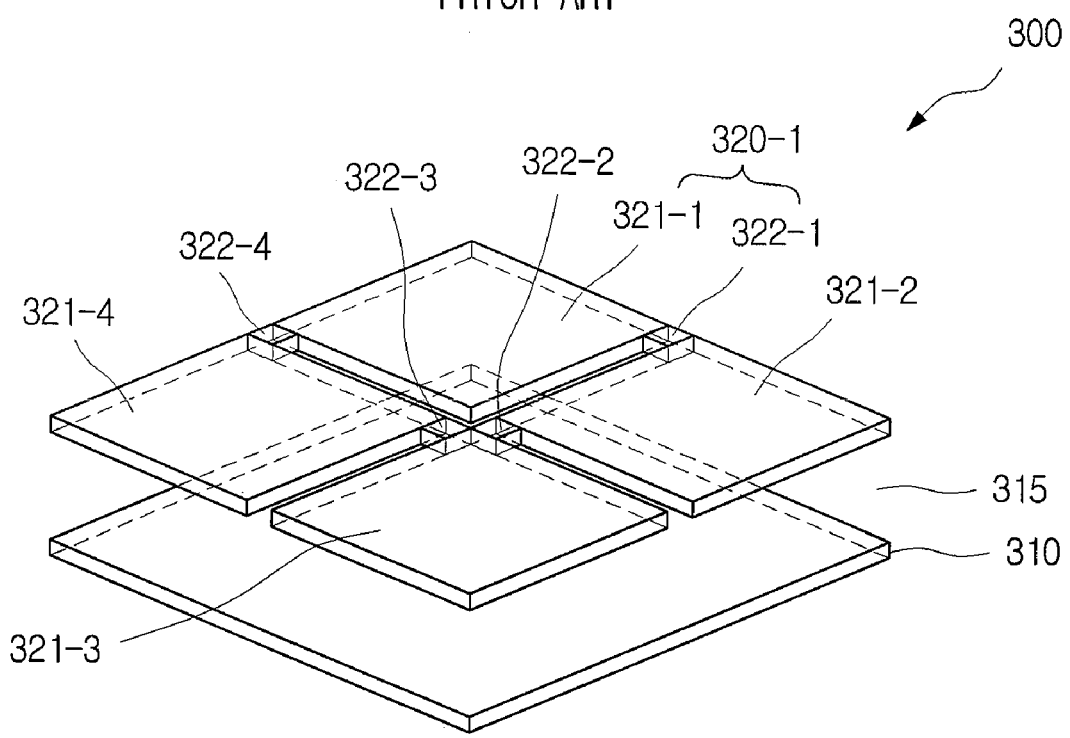
FIG. 3 is a schematic view showing a PT-EBG structure as another example of an electromagnetic bandgap structure in accordance with a conventional art.

Here, if it is assumed that any two electric circuits having different operation frequencies (refer to the first electric circuit 130 and the second electric circuit 140 in FIG. 1, described above) are implemented in the printed circuit board, the noise resource point and the noise blocking destination point can correspond to each position in which the two electric circuits will be implemented.

A stitching via can electrically connect any two metal plates of a plurality of metal plates to each other. All accompanying drawings of this specification show that the stitching via electrically connects two adjacent metal plates to each other. However, it may be unnecessary that any two metal plates connected by the stitching via are adjacent to each other. Also, even though it is shown that one metal plate is connected to another metal plate by one stitching via, it is evidently unnecessary that the electromagnetic bandgap structure has any limitation to the number of the stitching vias connecting any two metal plates. However, all below descriptions focus on the case that two adjacent metal plates are connected to each other by one stitching via.

The stitching via 440 can be formed to include a first via 441, a second via 442 and a connection pattern 443 in order to electrically connect two adjacent metal plates.

Herein, the first via 441 can be formed to start from one end part 441a connected to the first metal plate 430-1 and penetrate the dielectric layer 420, and the second via 442 can be formed to start from one end part 442a connected to the second metal plate 430-2 and penetrate the dielectric layer 420. The connection pattern 443 can be placed on the same planar surface as the metal layer 410 and have one end part, connected to the other end part 441b of the first via 441, and the other end part, connected to the other end part 442b of the second via 442. At this time, it is evident that a via land having a larger size than the via can be formed at one end part and the other end part of each via in order to reduce a position error of a drilling process for forming the via. Accordingly, the pertinent detailed description will be omitted.

At this time, a clearance hole 450 can be formed at an edge of the connection pattern 443 of the stitching via 440 in order to prevent the metal plates 430-1 and 430-2 to be electrically connected to the metal layer 410.

The two adjacent metals 430-1 and 430-2 may not be connected on the same planar surface in the electromagnetic bandgap structure of FIG. 4A. Instead, the two adjacent metals 430-1 and 430-2 can be connected to each other through another planar surface (i.e. the same planar surface as the metal layer 410) by the stitching via 440. Accordingly, the electromagnetic bandgap structure 400 having the stitching via 440 of FIG. 4A can more easily acquire an inductance component with a longer length than that of connecting the adjacent metal plates to each other on the same planar surface under the same conditions. In addition, since the adjacent metal plates of the present invention are connected to each other by the stitching via 440, it is unnecessary to form an additional pattern for electrically connecting the metal plates placed on a second layer. This can make a spaced distance between the metal plates narrower. Accordingly, it can be possible to increase the capacitance component formed between the adjacent metal plates.

Described below is the principle by which the structure shown in FIG. 4A can function as the electromagnetic bandgap structure blocking a signal of a certain frequency band. The dielectric layer 420 can be interposed between the metal layer 410 and the metal plates 430-1 and 430-2. This may cause a capacitance component to be formed between the metal layer 410 and the metal plates 430-1 and 430-2 and between the two adjacent metal plates. Also, there may be an inductance component connecting through the first via 441→the connection pattern 443→the second via 442 between the two adjacent metal plates by the stitching via 440. At this time, the value of the capacitance component can vary according to various factors such as the spaced distances between the metal layer 410 and the metal plates 430-1 and 430-2 and between the two adjacent metal plates, the dielectric constant of a dielectric material forming the dielectric layer 420 and the size, shape and area of the metal plate. Also, the value of the inductance component can vary according to various factors such as the shape, length, depth, width and area of the first via 441, a second via 442 and the connection pattern 443. Accordingly, adjusting and designing various aforementioned factors adequately can make it possible to allow the structure of FIG. 4A to function as the electromagnetic bandgap structure (i.e. a band stop filter) for removing or blocking a certain noise or a certain signal of an object frequency band. This can be easily understood through the equivalent circuit of FIG. 4B.

Comparing the equivalent circuit of FIG. 4B with the electromagnetic bandgap structure of FIG. 4A, an inductance component L1 can correspond to the first via 441, and an inductance component L2 can correspond to the second via 442. An inductance component L3 can correspond to the connection pattern 443. C1 can be a capacitance component by the metal plates 430-1 and 430-2 and another dielectric layer and another metal layer to be placed above the metal plates 430-1 and 430-2. C2 and C3 can be capacitance components by the metal layer 410 placed on the same planar surface as the connection pattern 443 and another dielectric layer and another metal layer to be placed below the planar surface of the connection pattern 443.

The electromagnetic bandgap structure shown in FIG. 4A can function as a band stop filter, which blocks a signal of a certain frequency band according to the above equivalent circuit. In other words, as seen in the equivalent circuit of FIG. 4B, a signal x of a low frequency band (refer to FIG. 4B) and a signal y of a high frequency band (refer to FIG. 4B) can pass through the electromagnetic bandgap structure, and signals z1, z2 and z3 of a certain frequency band (refer to FIG. 4B) ranging between the low frequency band and the high frequency band are blocked by the electromagnetic bandgap structure.

Accordingly, if the structure of FIG. 4A is repeatedly arranged on a whole part (refer to FIG. 5A. FIG. 5B, FIG. 5C and FIG. 5D) or a part (refer to FIG. 5E) of an inner surface of the printed circuit board (the same can be applied to the structure of FIG. 6 through FIG. 9 in accordance with an embodiment of the present invention described below) as a noise transferable path, it is possible to function as the electromagnetic bandgap structure that can prevent a signal of a certain frequency band from being transferred.

The identical or similar idea can be applied to the electromagnetic bandgap structure of FIG. 4C.

The electromagnetic bandgap structure of FIG. 4C has no metal layer corresponding to the reference numeral 410 as compared with the electromagnetic bandgap structure of FIG. 4A.

If there is a metal layer on the same planar surface to correspond to an area on which the connection pattern 443 will be formed, the connection pattern 443 can be manufactured in the form of being accommodated in the clearance hale 450 formed in the metal layer 410 on the same planar surface as shown in FIG. 4A. However, no additional metal layer may be placed in the area in which the connection pattern 443 will be formed, as shown in FIG. 4C. Of course, there may be the dielectric layer 420 below the metal plates in FIG. 4C.

Although not shown in the accompanying drawings, it may not be always necessary that the 2-layered electromagnetic bandgap structure including the stitching via is formed to have a stacked structural form in which the metal plates 430-1 and 430-2 are stacked in the dielectric layer 420 and the dielectric layer 420 is stacked in the metal layer 410. The 2-layered electromagnetic bandgap structure including the stitching via can be formed to have another structural shape including a lower layer in which the metal plates are placed, an upper layer in which the metal layer is placed, the dielectric layer interposed between the lower layer and the upper layer and the stitching via, penetrating the dielectric layer (i.e. a structural form, with the position of the upper layer and the lower layer inversed from that of FIG. 4A).

Of course, this case can be expected to have the identical or similar noise blocking effect described above.

Hereinafter, the electromagnetic bandgap structure in accordance with an embodiment of the present invention will be described in detail with reference to FIG. 6 through FIG. 9. Below descriptions focus on the difference from the aforementioned electromagnetic bandgap structure, and the description of the content that can be duplicated or be equally applied as described above as shown in FIG. 4A through FIG. 5E (for example, the arrange method of the metal plates, the arrange position, the connection method, and the detail of the stitching via) will be omitted.

Figure 7:
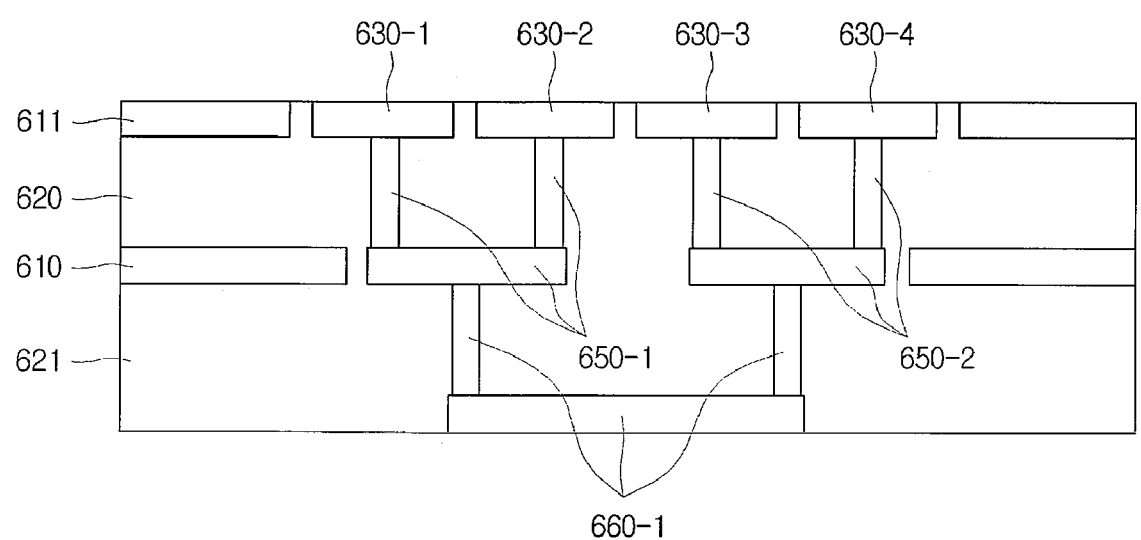
FIG. 7 is a vertical sectional view showing the electromagnetic bandgap structure shown in FIG. 6.
Figure 9:
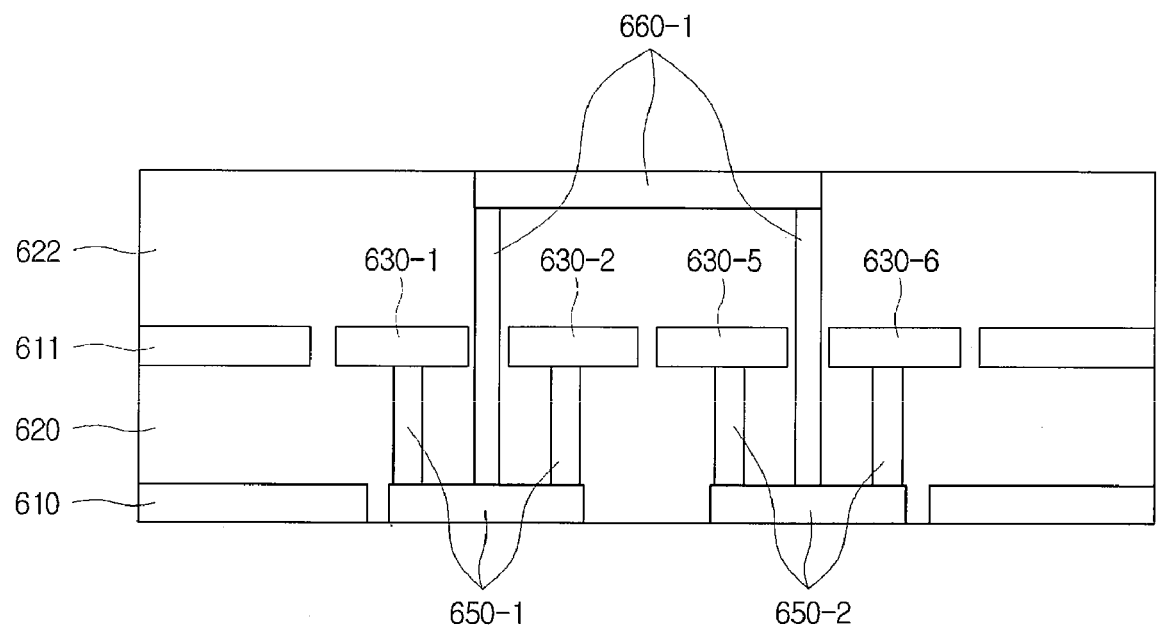
FIG. 9 is a vertical sectional view showing another transformational example of the electromagnetic bandgap structure shown in FIG. 6.

FIG. 6 is a 3-D perspective view showing an electromagnetic bandgap structure including a stitching via chain in accordance with an embodiment of the present invention. FIG. 7 is a vertical sectional view showing the electromagnetic bandgap structure shown in FIG. 6. FIG. 8 is a 3-D perspective view showing some transformational example of the electromagnetic bandgap structure shown in FIG. 6. FIG. 9 is a vertical sectional view showing another transformational example of the electromagnetic bandgap structure shown in FIG. 6.

In accordance with an embodiment of the present invention, an electromagnetic bandgap structure can include 4 or more conductive plates: a first stitching via, configured to have a part electrically connecting any two conductive plates of the conductive plates to each other; a second stitching via, configured to have a part electrically connecting two conductive plates except for the above any two conductive plates to each other; and a stitching via chain, configured to electrically connect the first stitching via and the second stitching via. It will be described in detail with reference to the accompanying drawings.

With reference to FIG. 6, 8 metal plates 630-1 through 630-8 (hereinafter, represented by reference numeral 630) are placed on any one planar surface in the printed circuit board. Of course, as described above, it is not always necessary that the metal plates 630 are placed on the same planar surface as shown in the drawing.

At this time, the two adjacent metal plates of 4 metal plates 630-1, 630-2, 630-3 and 630-4 on the left side of the drawing are electrically connected to each other by each one of the stitching vias, respectively. For example, the metal plate of the reference numeral 630-1 and the metal plate of the reference numeral 630-3 can be electrically connected to each other by the stitching via of the reference numeral 650-1 penetrating the dielectric layer 620 and having a part through the same planar surface of the metal layer 610.

As such, the two adjacent metal plates of 4 metal plates 630-5, 630-6, 630-7, and 630-8 on the right side of the drawing are electrically connected to each other by each one of the stitching vias, respectively. For example, the metal plate of the reference numeral 630-5 and the metal plate of the reference numeral 630-6 can be also electrically connected to each other by the stitching via of the reference numeral 650-2 penetrating the dielectric layer 620 and having a part through the same planar surface of the metal layer 610.

As such, the connection method of which the 4 metal plates on the left side of the drawing are electrically connected to each other and the 4 metal plates at the right of the drawing are electrically connected to each other by the stitching via is entirely identical to the electromagnetic bandgap structure shown in FIG. 4A or FIG. 4B as described above.

The structural difference of the electromagnetic bandgap structure in accordance with the present invention from the structure as shown in FIG. 4A and FIG. 4B is the difference of the method of which the 4 metal plates on the left side of the drawing and the 4 metal plates on the right side of the drawing are electrically connected to each other.

In the case of the same structure of the electromagnetic bandgap structure as shown in FIG. 4A and FIG. 4B, the metal plate of the reference numeral 630-2 and the metal plate of the reference numeral 630-5, as well as the metal plate of the reference numeral 630-3 and the metal plate of the reference numeral 630-8, are electrically connected to each other by the stitching via, respectively.

However, in the case of the electromagnetic bandgap structure as shown in FIG. 6, the 4 metal plates on the left side of the drawing and the 4 metal plates on the right side of the drawing are electrically connected to each other by the stitching via chain (with reference to 660-1 and 660-2). In other words, the metal plate of the reference numeral 630-2 and the metal plate of the reference numeral 630-5, as well as the metal plate of the reference numeral 630-3 and the metal plate of the reference numeral 630-8, are not directly connected to each other by the stitching via but indirectly connected to each other by the connection of a chain structure (i.e. the stitching via chain) connecting between any two stitching vias directly connected to the metal plates (with reference to 650-1 and 650-2). This is the core property of the electromagnetic bandgap structure of the present invention.

In accordance with the present invention, the stitching via chain can be manufactured in two forms.

In the first form, the stitching via chain can be manufactured as a form of another stitching via electrically connecting between any two stitching vias on a planar surface that is different from each of planar surfaces of the two stitching vias. This is the same form shown in FIG. 6 through FIG. 9.

In the second form, the stitching via chain can be manufactured as a form of a conductive connection pattern (i.e. a metal trace) electrically connecting between any two stitching vias on the same planar surface through which the two stitching vias pass (for example, the planar surface on which the metal layer 610 is placed). Although it is not shown in the accompanying drawings, it shall be easily understood by any person of ordinary skill in the art.

At this time, if the metal layer 610 forms a layer that is different from the metal plates 630 with regard to electrical signals (for example, as described above shown in FIG. 4A, the metal plates are electrically connected to any one of the power layer and the ground layer, and the metal layer function as another layer), a clearance hole can be formed in a certain part of the metal layer 610 coinciding with the path through which the stitching via and the stitching via chain (i.e. the conductive connection pattern) pass because the metal plates 630 need to be electrically separated from the metal layer 610.

However, it is assumed that the stitching via chain is manufactured as the first form (the form of the stitching via) and will be described in the below description.

It is possible to confirm more clearly the relation of electrical connection between any two stitching vias by using the stitching via chain by referring to FIG. 7 through FIG. 9. Here, FIG. 6 and FIG. 9 are sectional views which focus on showing the metal plates connected by the stitching via chain and the stitching vias.

For the convenience of description, the metal plates of the reference numerals 630-1, 630-2, 630-5, and 630-6 are referred as a first metal plate, a second metal plate, a fifth metal plate, and a sixth metal plate, respectively, and the stitching vias of the reference numerals 650-1 and 650-2 are referred as a first stitching via and a second stitching via, respectively. The reference numeral 660-1 is the stitching via chain manufactured as a form of the stitching via.

With reference to FIG. 7 and FIG. 9, the stitching via chain 660-1 can electrically connect the first and second metal plates 630-1 and 630-2 and the fifth and sixth metal plates 630-5 and 630-6 electrically separated from each other at the start by electrically connecting the first stitching via 650-1 and the second stitching via 650-2.

The stitching via chain 660-1 can include a first via having one end part connected to the part of the first stitching via 650-1 (refer to a via which is illustrated on the left side of FIG. 7 and FIG. 9 in the elements constituting the stitching via chain 660-1), a second via having one end part connected to the part of the second stitching via 650-2 (refer to a via which is illustrated on the right side of FIG. 7 and FIG. 9 in the elements constituting the stitching via chain 660-1), and a conductive connection pattern connecting the other end part of the first via and the other end part of the second via on the same planar surface.

In the case of the stitching via chain 660-1 of FIG. 7, the first via and the second via are formed as penetrating a dielectric layer (refer to 621 of FIG. 7) which is placed below a planar surface through which the first stitching via 650-1 and the second stitching via 650-2 pass (i.e. the same planar surface of the metal plate 610).

On the other hand, in the case of the stitching via chain 660-1 of FIG. 9, the first via and the second via are formed as penetrating dielectric layers (refer to 620 and 622 of FIG. 9) which are placed in the direction above a planar surface through which the first stitching via 650-1 and the second stitching via 650-2 pass (i.e. the same planar surface of the metal plate 610).

In other words, the first feature of the stitching via chain 660-1 is that the stitching via chain 660-1 is manufactured not to connect any two metal plates but to connect any two stitching vias, and the second feature is that the stitching via chain 660-1 is manufactured to pass through a planar surface which is different from a planar surface through which the any two stitching via pass. Accordingly, if it meets the aforementioned two features, it is possible to variously modify the position and the direction in which the any two vias (i.e. the first via and the second via) constituting the stitching via chain are formed.

In addition, various other modifications as a form of a conductive connection pattern connecting between the two vias can be possible. Although the conductive connection pattern is manufactured as a straight line form in FIG. 6, the conductive connection pattern also can have a form of a line broken more than once such as a broken zigzag line (refer to 660a-1 and 660b-1 of FIG. 8).

In addition, FIG. 6 through FIG. 9 show that each of the stitching vias connecting between any two metal plates is manufactured to have a form penetrating the dielectric layer (refer to 620) and passing through the same planar surface of the metal layer (refer to 610). However, some of the stitching vias can be formed in the direction above the metal plates 630, unlike FIG. 6 through FIG. 9.

For example, in FIG. 7 or FIG. 9, it can be assumed that the first stitching via 650-1 is formed in the direction below the metal layers 630 like the original drawing, and the second stitching via 650-2 is formed in the direction above the metal layers 630 unlike the original drawing. However, if the forming direction and position of the first stitching via and the second stitching via constituting the stitching via chain are properly adjusted, it shall be easily understood by any person of ordinary skill in the art that the two stitching vias can be connected to each other by the stitching via chain.

In addition, FIG. 6 through FIG. 9 show that the stitching via chain is connected to a connection pattern (refer to 443 of FIG. 4A) in the stitching vias. However, it is evident that the stitching via chain can be directly connected to the other end part (refer to 441b or 442b of FIG. 4A) of the via (refer to 441 or 442 of FIG. 4A) constituting the stitching via.

Also, although FIG. 6 through FIG. 9 show that the stitching via chain connects between any two stitching vias, it is evidently unnecessary that any two stitching vias connected to each other by the stitching via chain are adjacent.

The electromagnetic bandgap structure of the present invention can acquire more inductance components than the structure of FIG. 4A and FIG. 4C, by having the stitching via chain as described above. For example, as shown in FIG. 6, it is evident that connecting the second metal plate 630-2 and the fifth metal plate 630-5 by the stitching via chain 660-1 is better than directly being connected by any one stitching via with regard to acquiring the length.

Accordingly, despite the same size of the metal plate, the electromagnetic bandgap structure including the stitching via chain in accordance with the present invention is expected to have a lower badgap frequency band than the structure of FIG. 4A and FIG. 4C.

Figure 10:
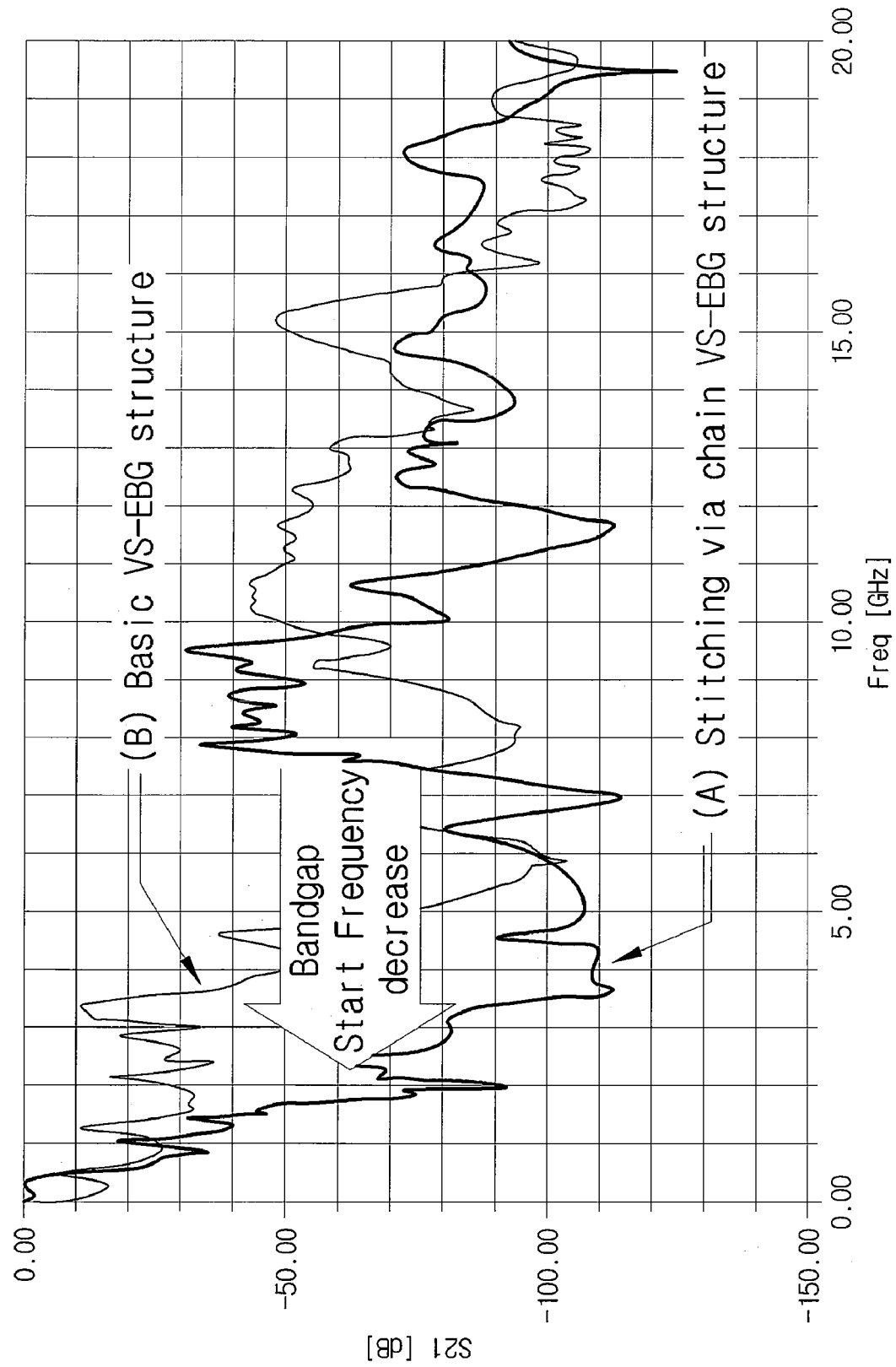
FIG. 10 is a graph showing a bandgap frequency property of the electromagnetic bandgap structure shown in FIG. 6.

FIG. 10 shows a simulation result that is analyzed by scattering parameters in order to check whether an electromagnetic bandgap structure including the stitching via chain provided by the present invention has the band blocking property of a certain frequency band.

With reference to FIG. 10, while the electromagnetic bandgap structure of FIG. 4A has the bandgap frequency band formed from about 4.7 GHz on a blocking rate −50 dB basis, it can be recognized that the electromagnetic bandgap structure shown in FIG. 6 has the bandgap frequency band formed from about 1.7 GHz on the same blocking rate (i.e. −50 dB) basis and the same design condition (i.e. the same metal plate size, same via length, same dielectric material, etc). In other words, it is seen that the electromagnetic bandgap structure shown in FIG. 6 has the bandgap frequency band reduced by about 3 GHz as compared with the electromagnetic bandgap structure of FIG. 4A.

As described above, this is because the inductance component value acquired by the stitching via chain increase. Accordingly, the present invention has an advantageous structure for reducing the cell size (i.e. the metal plate size) of the electromagnetic bandgap structure in order to implement the same bandgap frequency.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure comprising:
   4 or more conductive plates;
   a first stitching via, configured to electrically connect any two of the conductive plates with each other by having a part of the first stitching via pass through a planar surface that is different from a planar surface of the conductive plates;
   a second stitching via, configured to electrically connect another two of the conductive plates with each other by having a part of the second stitching via pass through a planar surface that is different from a planar surface of the conductive plates; and
   a stitching via chain, electrically connecting the first stitching via and the second stitching via with each other;
   wherein the electromagnetic bandgap structure is disposed in an area of a noise transferable path between a noise source point and a noise blocking destination point of the printed circuit board.

2. The electromagnetic bandgap structure of claim 1, wherein the stitching via chain is another stitching via electrically connecting the first stitching via and the second stitching via with each other by having a part of the stitching via chain pass through a planar surface that is different from the planar surfaces through which the first stitching via or the second stitching via passes.

3. The electromagnetic bandgap structure of claim 2, wherein the stitching via chain comprises:
   a first via, having one end part connected to the part of the first stitching via;
   a second via, having one end part connected to the part of the second stitching via; and
   a conductive connection pattern, connecting the other end part of the first via and the other end part of the second via with each other on a same planar surface.

4. The electromagnetic bandgap structure of claim 3, wherein the conductive connection pattern is manufactured as a straight-line form or a line form broken one or more times.

5. The electromagnetic bandgap structure of claim 1, wherein the stitching via chain is a conductive connection pattern connecting the part of the first stitching via and the part of the second stitching via with each other on a same planar surface.

6. The electromagnetic bandgap structure of claim 5, wherein the conductive connection pattern is manufactured as a straight-line form or a line form broken one or more times.

7. The electromagnetic bandgap structure of claim 5, further comprising a conductive layer that is placed between the conductive plates and dielectric layers,
wherein a clearance hole is formed in a part of the conductive layer coinciding with a path through which the first stitching via, the second stitching via and the stitching via chain pass.

8. A printed circuit board comprising:
an electromagnetic bangap structure,
the electromagnetic bandgap structure comprising:
4 or more conductive plates;
a first stitching via, configured to electrically connect any two of the conductive plates with each other by having a part of the first stitching via pass through a planar surface that is different from a planar surface of the conductive plates;
a second stitching via, configured to electrically connect another two of the conductive plates with each other by having a part of the second stitching via pass through a planar surface that is different from a planar surface of the conductive plates; and
a stitching via chain, electrically connecting the first stitching via and the second stitching via with each other,
wherein the electromagnetic bandgap structure is disposed in an area of a noise transferable path between a noise source point and a noise blocking destination point of the printed circuit board.

9. The electromagnetic bandgap structure of claim 8, wherein the stitching via chain is another stitching via electrically connecting the first stitching via and the second stitching via with each other by having a part of the stitching via chain pass through a planar surface that is different from the planar surfaces through which the first stitching via or the second stitching via passes.

10. The electromagnetic bandgap structure of claim 9, wherein the stitching via chain comprises:

a first via, having one end part connected to the part of the first stitching via;
a second via, having one end part connected to the part of the second stitching via; and
a conductive connection pattern, connecting the other end part of the first via and the other end part of the second via with each other on a same planar surface.

11. The electromagnetic bandgap structure of claim 10, wherein the conductive connection pattern is manufactured as a straight-line form or a line form broken one or more times.

12. The electromagnetic bandgap structure of claim 8, wherein the stitching via chain is a conductive connection pattern, connecting the part of the first stitching via and the part of the second stitching via with each other on a same planar surface.

13. The electromagnetic bandgap structure of claim 12, wherein the conductive connection pattern is manufactured as a straight-line form or a line form broken one or more times.

14. The electromagnetic bandgap structure of claim 12, further comprising a conductive layer that is placed between the conductive plates and dielectric layers,
wherein a clearance hole is formed in a part of the conductive layer coinciding with a path through which the first stitching via, the second stitching via and the stitching via chain pass.

15. The electromagnetic bandgap structure of claim 14, wherein the conductive plates are electrically connected to one of a ground layer and a power layer, and the conductive layer is electrically connected to the other of the ground layer and the power layer.

16. The electromagnetic bandgap structure of claim 14, wherein the conductive plates are electrically connected to one of a ground layer and a signal layer, and the conductive layer is electrically connected to the other one of the ground layer and the signal layer.

17. The printed circuit board of claim 8, wherein, two electronic circuits having different operation frequencies are installed in the printed circuit board, and the noise source point and the noise blocking destination point correspond to one position and the other position, respectively, in which the two electric circuits are to be installed.

* * * * *